United States Patent
Yen et al.

(10) Patent No.: US 9,412,649 B1
(45) Date of Patent: Aug. 9, 2016

(54) METHOD OF FABRICATING SEMICONDUCTOR DEVICE

(71) Applicant: Taiwan Semiconductor Manufacturing Company, Ltd., Hsin-Chu (TW)

(72) Inventors: Yung-Sung Yen, New Taipei (TW);
Chung-Ju Lee, Hsinchu (TW);
Chun-Kuang Chen, Hsinchu County (TW); Chia-Tien Wu, Taichung (TW);
Ta-Ching Yu, Hsinchu County (TW);
Kuei-Shun Chen, Hsinchu (TW);
Ru-Gun Liu, Hsinchu County (TW);
Shau-Lin Shue, Hsinchu (TW);
Tsai-Sheng Gau, HsinChu (TW);
Yung-Hsu Wu, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/621,660

(22) Filed: Feb. 13, 2015

(51) Int. Cl.
| | |
|---|---|
| *H01L 21/308* | (2006.01) |
| *H01L 21/768* | (2006.01) |
| *H01L 21/311* | (2006.01) |
| *H01L 23/538* | (2006.01) |
| *H01L 21/033* | (2006.01) |
| *H01L 21/027* | (2006.01) |

(52) U.S. Cl.
CPC ...... *H01L 21/76816* (2013.01); *H01L 21/0274* (2013.01); *H01L 21/0332* (2013.01); *H01L 21/3088* (2013.01); *H01L 21/31144* (2013.01); *H01L 21/76802* (2013.01); *H01L 21/76811* (2013.01); *H01L 21/76877* (2013.01); *H01L 23/5386* (2013.01)

(58) Field of Classification Search
CPC ............... H01L 21/31144; H01L 21/76811; H01L 21/76816; H01L 21/0274; H01L 21/3088; H01L 21/76802
See application file for complete search history.

(56) References Cited

U.S. PATENT DOCUMENTS

| | | | | |
|---|---|---|---|---|
| 7,309,654 B2 * | 12/2007 | Schaller | ............ | H01L 21/31116 257/E21.252 |
| 7,759,239 B1 * | 7/2010 | Lin | ..................... | H01L 21/0337 257/E21.218 |
| 8,216,767 B2 | 7/2012 | Wang et al. | | |
| 8,323,870 B2 | 12/2012 | Lee et al. | | |
| 8,580,117 B2 | 11/2013 | Kao et al. | | |
| 8,658,344 B2 | 2/2014 | Wang et al. | | |
| 8,715,919 B2 | 5/2014 | Chang et al. | | |
| 8,728,332 B2 * | 5/2014 | Lin | ..................... | H01L 21/0274 216/13 |
| 8,741,551 B2 | 6/2014 | Wu et al. | | |
| 9,123,662 B2 * | 9/2015 | Chang | ............... | H01L 21/31144 |
| 9,130,017 B2 * | 9/2015 | Shih | .................. | H01L 21/76811 |

(Continued)

*Primary Examiner* — Bac Au
(74) *Attorney, Agent, or Firm* — Haynes and Boone, LLP

(57) ABSTRACT

A method for fabricating a semiconductor device includes forming a hard mask (HM) layer over a material layer, forming a first trench in the HM layer, which extends along a first direction. The method also includes forming a first patterned resist layer over the HM layer. The first patterned resist layer has a first opening and a second opening a second direction. The first opening overlaps with the first trench in a middle portion of the first trench and the second opening overlaps with the first trench at an end portion of the first trench. The method also includes etching the HM layer through the first patterned resist layer to form a second trench and a third trench in the HM layer and forming a first feature to fill in a section of the first trench between the second trench and the third trench.

20 Claims, 17 Drawing Sheets

(56) References Cited

U.S. PATENT DOCUMENTS

| | | | |
|---|---|---|---|
| 9,287,131 B2* | 3/2016 | Yuan | H01L 21/0274 |
| 2013/0062774 A1* | 3/2013 | Ko | H01L 21/31144 |
| | | | 257/774 |
| 2013/0309853 A1* | 11/2013 | Sung | H01L 21/3088 |
| | | | 438/585 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0311086 A1* | 10/2015 | Chang | H01L 21/3086 |
| | | | 257/618 |
| 2015/0340469 A1* | 11/2015 | Chen | H01L 29/66795 |
| | | | 438/283 |
| 2015/0380261 A1* | 12/2015 | Chang | H01L 21/308 |
| | | | 438/690 |
| 2016/0035628 A1* | 2/2016 | Tsujita | H01L 21/823828 |
| | | | 438/703 |
| 2016/0086809 A1* | 3/2016 | Yang | H01L 21/3088 |
| | | | 257/618 |

\* cited by examiner

METHOD OF FABRICATING SEMICONDUCTOR DEVICE

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process has decreased. When a semiconductor device such as a metal-oxide-semiconductor field-effect transistor (MOSFET) is scaled down through various technology nodes, challenges rise to reduce irregularities/distortions in features/patterns formed over a wafer.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
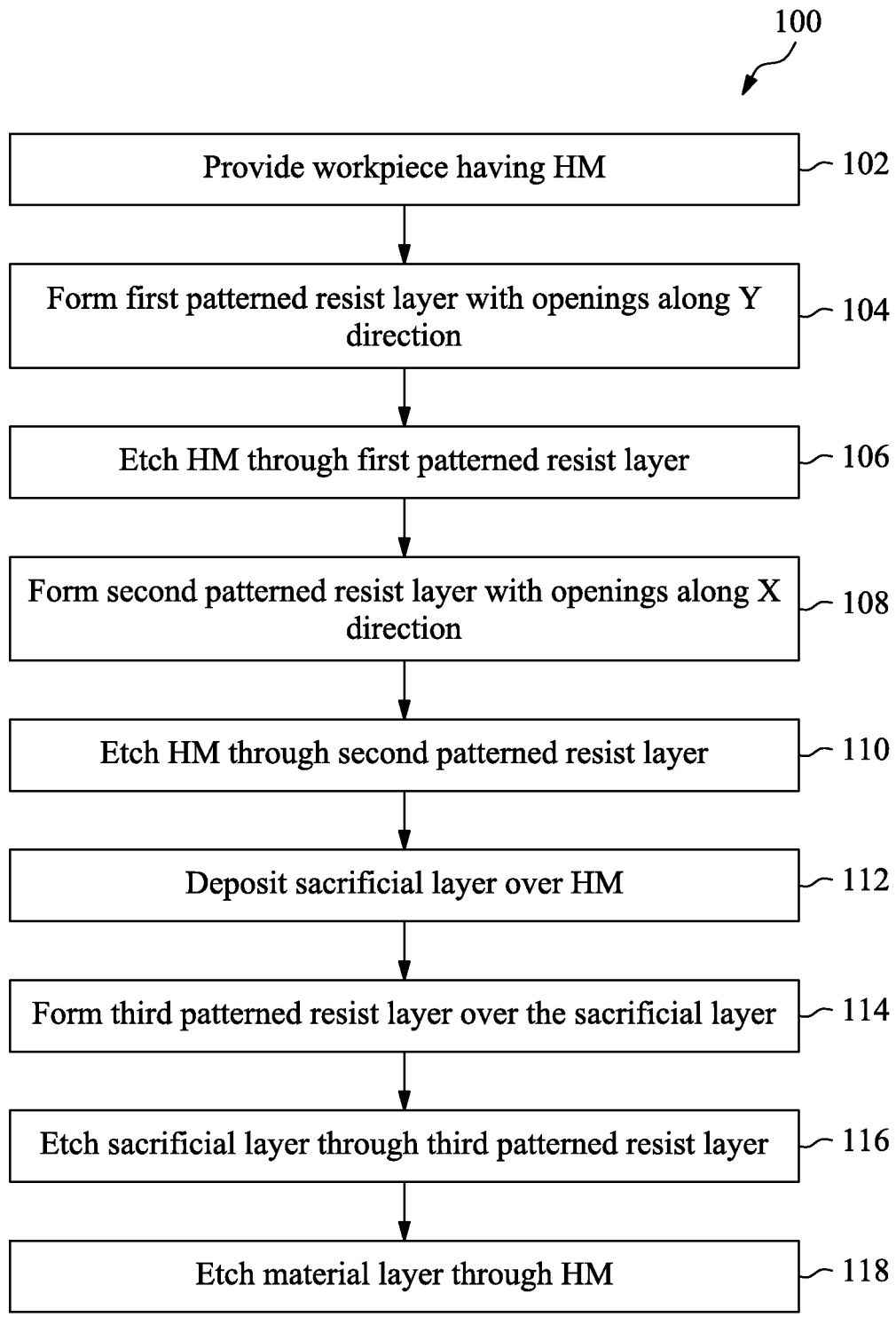
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a workpiece 205 of a semiconductor device 200 shown in FIG. 2 and the semiconductor device 200, shown in FIGS. 4A to 11D.

Figure 2:
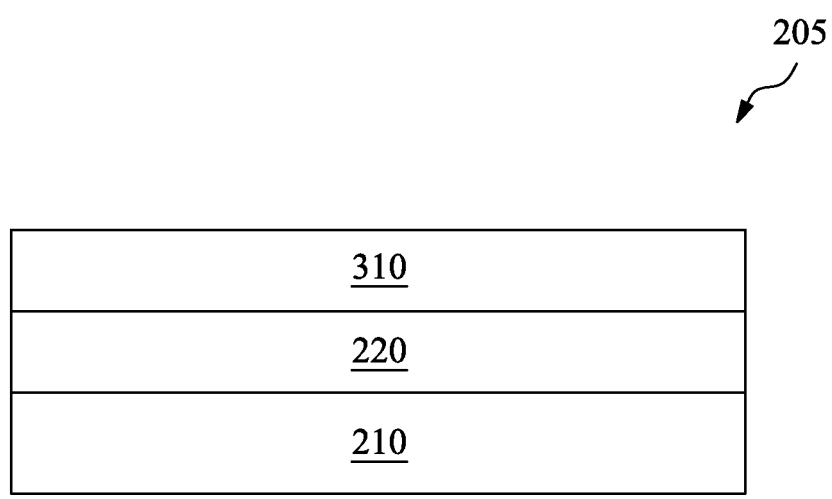
FIG. 2 is a cross section view of an example of a workpiece of a semiconductor device in accordance with some embodiments.

Referring to FIGS. 1 and 2, the method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

In the present embodiment, the workpiece 205 includes a material layer 220 over the substrate 210 and a hard mask (HM) 310 deposited over the material layer 220. The material layer 220 may include a dielectric layer, such as silicon oxide, silicon nitride, or silicon oxynitride, low-k dielectric material, or other suitable materials. The material layer 220 may also include a conductive layer such as a polysilicon, a metal layer, or/and other suitable material. The HM 310 may include silicon oxide, silicon nitride, oxynitride, silicon carbide, titanium oxide, titanium nitride, tantalum oxide, tantalum nitride, and/or any suitable materials. In the present embodiment, the HM 310 may include a material which is different from the material layer 220 to achieve etching selectivity during subsequent etch processes. The material layer 220 and the HM 310 may be deposited over the substrate 210 by suitable techniques, such as chemical vapor deposition (CVD), atomic layer deposition (ALD), physical vapor deposition (PVD), thermal oxidation, combinations thereof, or other suitable techniques.

In the present embodiment, a plurality of features (e.g. trenches) is to be formed in the material layer 220. In order to form trenches in the material layer 220, it is usually to form a patterned resist layer with openings over the HM 310 first, then etching the HM 310 through openings to pattern the HM 310, and then etching the material layer 220 through the patterned HM 310 to form trenches. The patterned resist layer may be formed by a lithography process equipped with an optical imaging tool.

Figure 3A:
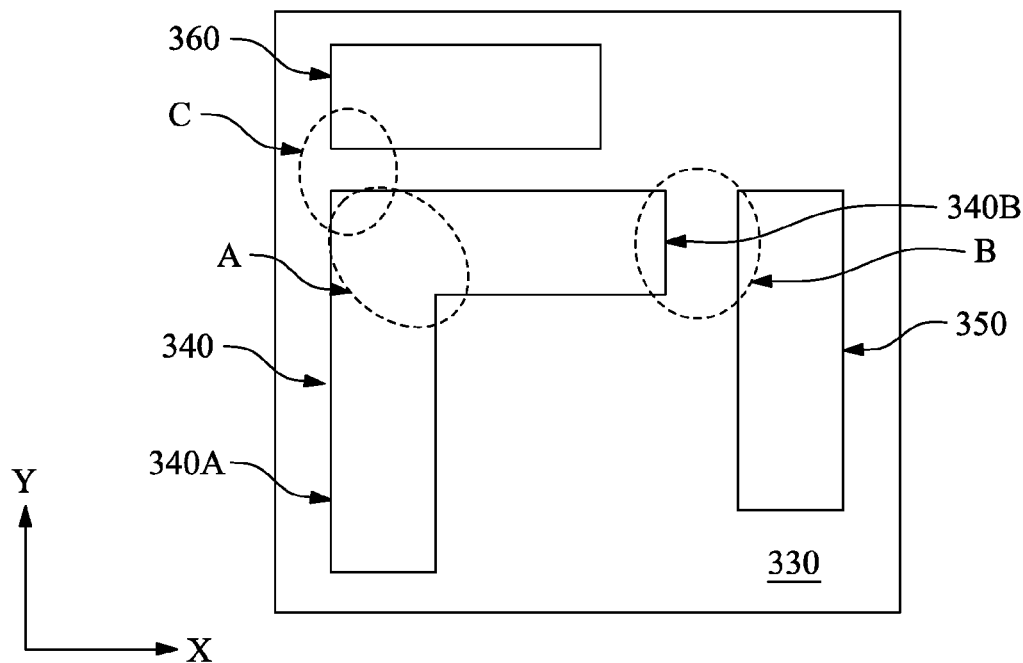
FIGS. 3A and 3B are schematic views of patterns formed over a resist layer by a lithography process.

FIG. 3A shows an ideal patterned resist layer 330 which includes a first opening 340 having a L-shape, that has a first portion 340A extending along a first direction (Y direction) and a second portion 340B extending along a second direction (X direction), which is perpendicular to the first direction. The first portion 340A connects to the second portion 340B at a location A. It is desired that the first portion 340A connects to the second portion 340B with a right angle (90 degree) at the location A. The patterned resist layer 330 also includes a second opening 350 and a third opening 360. For example, the second opening 350 is located close to an end of the second portion 340B of the first opening 340 at a location B. The third opening 360 is located close to the second portion 340B of the first opening 340 at a location C. It desired that each of opening, 340, 350 and 360, remain regular contour (such as a rectangular contour) at each end of the openings.

Figure 3B:
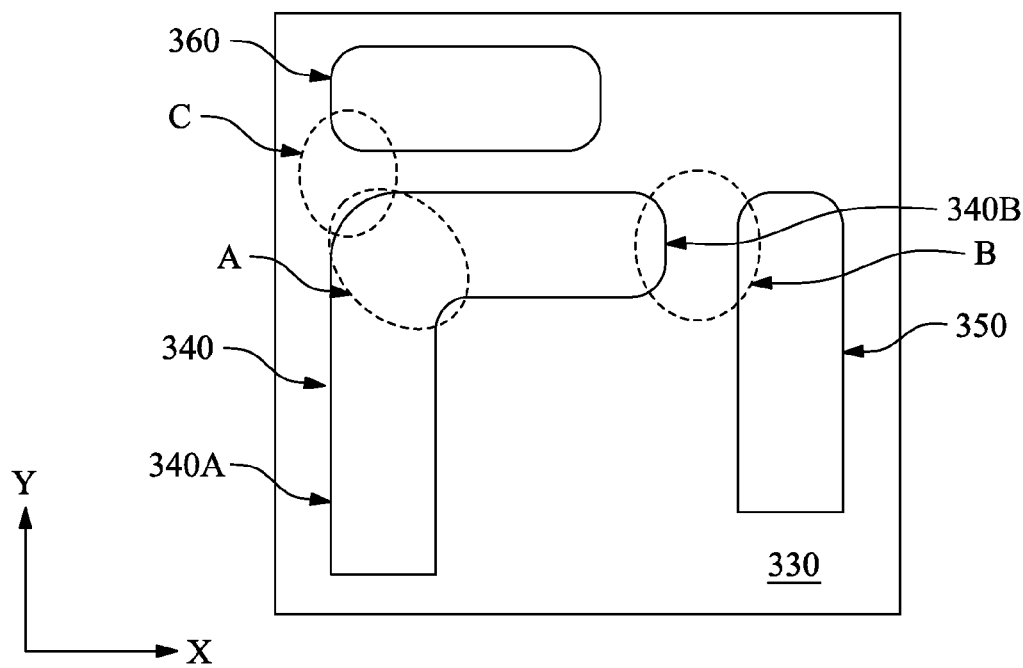

However, due to diffraction, resolution and other process effect of the optical imaging tool in a lithography process, irregularities/distortions in resist patterns (openings) may happen. FIG. 3B shows such problems that can occur to patterned resist layer 330. For example, when the first portion 340A and the second portion 340B of the first opening 340 are formed over a resist layer, a rounded corner distortion may be formed and the first portion 340A connects to the second portion 340B with a rounded angle at the location A. Furthermore, when the first, second and third openings, 340, 350 and 360 locate closely to each other such that a distance between them is smaller than a threshold distance $d_{th}$ of a lithography exposure process, they may have line end shortening distortions at locations, such as the location B and the location C. If these irregularities/distortions are transferred to form features (such as trenches) over a layer (such as the material layer 220) the substrate 210, it may significantly alter the electrical properties of the semiconductor device 200. The present discourse provides methods to reduce irregularities/distortions in forming trenches in the material layer 220.

Figure 4A:
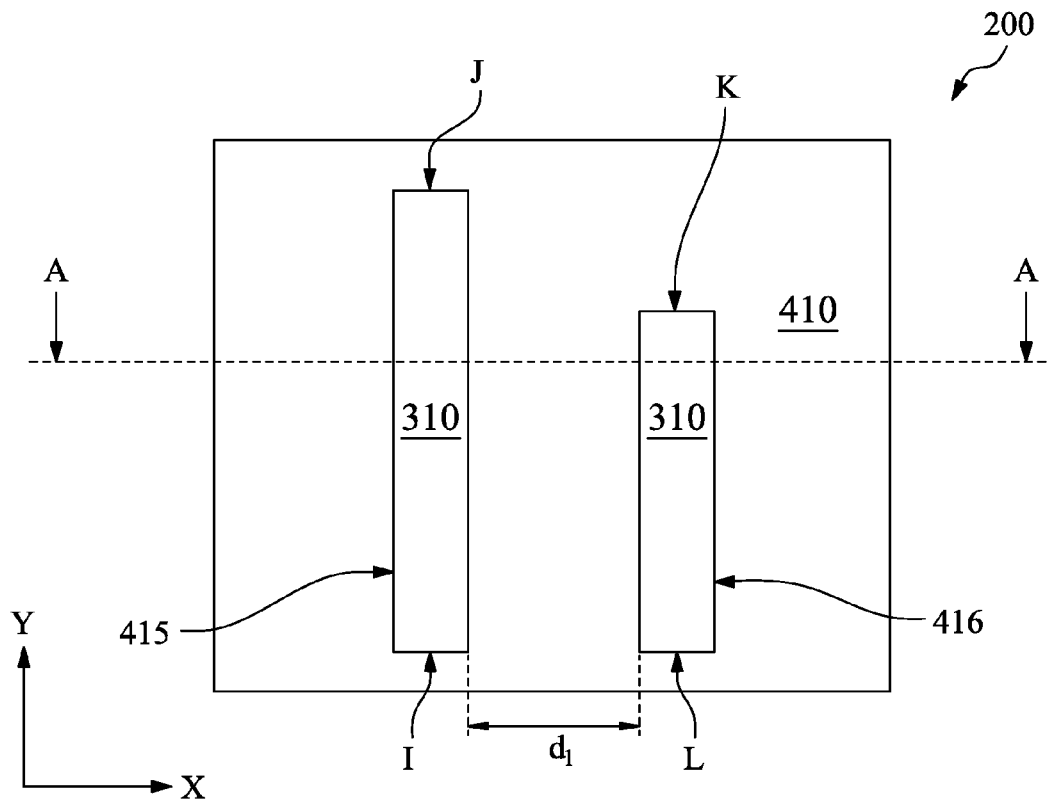
FIG. 4A is a top view of an example of a semiconductor device in accordance with some embodiments.
Figure 4B:
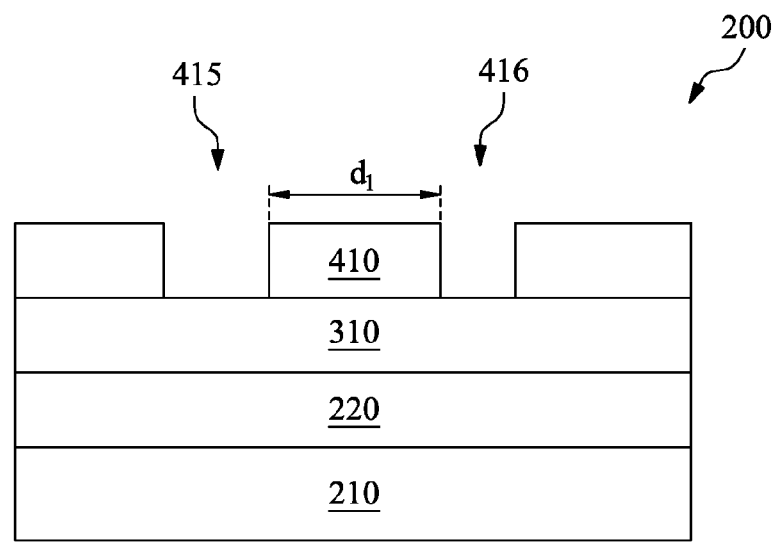
FIG. 4B is a cross-sectional view of an example semiconductor device in accordance with some embodiments, along the line A-A in FIG. 4A.

Referring to FIGS. 1 and 4A-4B, once the workpiece 205 is received, method 100 proceeds to step 104 by performing a first lithography process to form a first patterned resist layer 410 over the HM 310. The first patterned resist layer 410 has a first opening 415 and a second opening 416. Respective portions of the HM 310 are exposed in the first and second openings, 415 and 416. In the present embodiment, both of the first and second openings, 415 and 416, have rectangular shapes and extends along the Y-direction. An exemplary lithography process may include forming a resist layer, exposing the resist layer by a lithography exposure process, performing a post-exposure bake process, and developing the resist layer to form the patterned resist layer. In some embodiments, a first distance $d_1$ between the first opening 415 and the second opening 416 is chosen to be greater than a threshold distance $d_{th}$ of the lithography exposing process. Thus, the first and second openings, 415 and 416, are formed with regular contours (such as rectangular contours) at their opening ends: a first opening end I, a second opening end J, the third opening end K and a fourth opening end L, respectively.

Figure 5A:
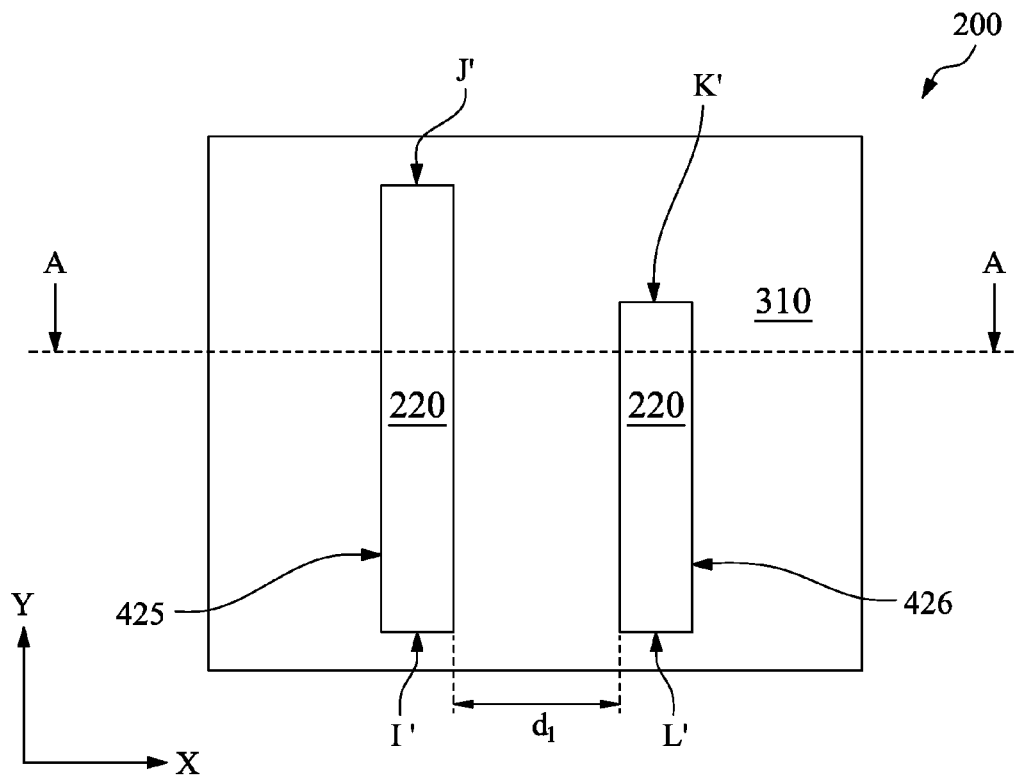
FIG. 5A is a top view of an example of a semiconductor device in accordance with some embodiments.
Figure 5B:
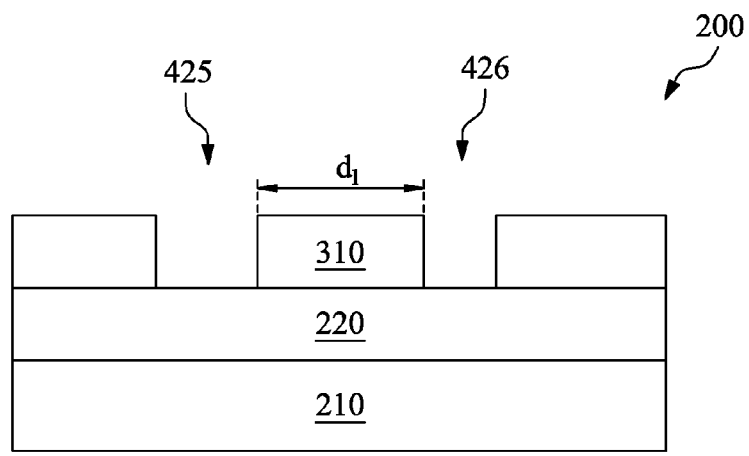
FIG. 5B is a cross-sectional view of an example semiconductor device in accordance with some embodiments, along the line A-A in FIG. 5A.

Referring to FIGS. 1 and 5A-5B, method 100 proceeds to step 106 by etching the HM 310 through the first patterned resist 410 to transfer the first and second openings, 415 and 416, to a first and second trenches, 425 and 426, in the HM 310, respectively. In some embodiments, the etch process includes an anisotropic dry etch. For example, the etch process is a plasma anisotropic etch. Therefore, regular contours of the first, second, third and fourth opening ends, I, J, K and L are transferred to a first, second, third and fourth trench ends, I', J', K' and L', respectively. In some embodiments, the etch process is properly chosen to selectively remove the HM 310 but does not substantially etch the material layer 220. As has been mentioned previously, with an adequate etch selectivity, the material layer 220 serves as an etch stop layer, which improves etch process window and profile control. A resist strip process is then applied to remove any remaining first patterned resist layers 410.

Figure 6A:
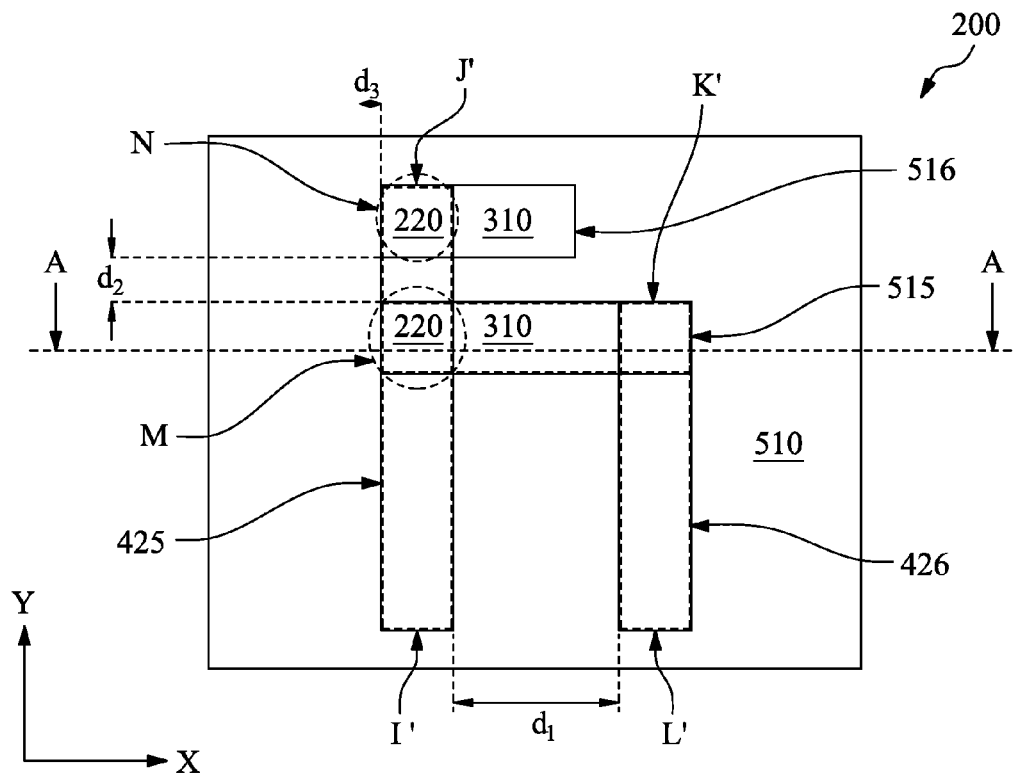
FIGS. 6A and 6C are top views of an example of a semiconductor device in accordance with some embodiments.
Figure 6B:
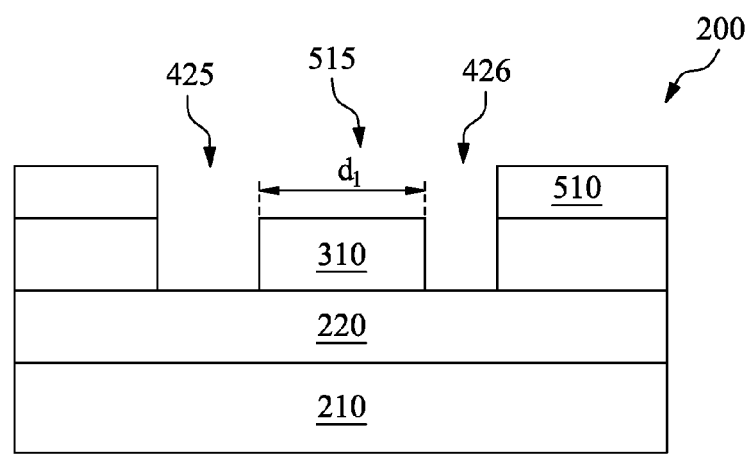
FIGS. 6B and 6D are cross-sectional views of an example semiconductor device in accordance with some embodiments, along the line A-A in FIGS. 6A and 6C, respectively.

Referring to FIGS. 1 and 6A-6B, the method 100 proceeds to step 108 by performing a second lithography process to form a second patterned resist layer 510 over the HM 310. The second patterned resist layer 510 has a third opening 515 and a fourth opening 516. In the present embodiment, both of the third and fourth openings, 515 and 516, extends along the X direction. The third opening 515 overlaps and extends perpendicularly with respect to the first trench 425 at a first location M. A portion of the first trench 425 is exposed within the third opening 515. The third opening 515 also overlaps and extends perpendicularly with respect to the second trench 426 at the third trench end K'. A respective portion of the second trench 426 is exposed within the third opening 515. The fourth opening 516 overlaps and extends perpendicularly with respect to the first trench 425 at the second trench end F. A respective portion of the first trench 425 is exposed within the fourth opening 516. The second patterned resist layer 510 is formed similarly in many respects to the first patterned resist layer 410 discussed above association with FIGS. 4A-4B.

In some embodiments, at some locations, a second distance $d_2$ between the third opening 515 and adjacent the fourth opening 516 is smaller than the threshold distance $d_{th}$ and irregularities/distortions (e.g. line end shortening) may happen for the third and fourth openings, 515 and 516, respectively. For example, the fourth opening 516 may have a line end shortening at its opening end at the first location M and a second location N. But these line end shortenings may not be transferred to trenches to be formed in the HM 310 at the first and second locations, M and N, which will be described in more detail below.

Figure 6C:
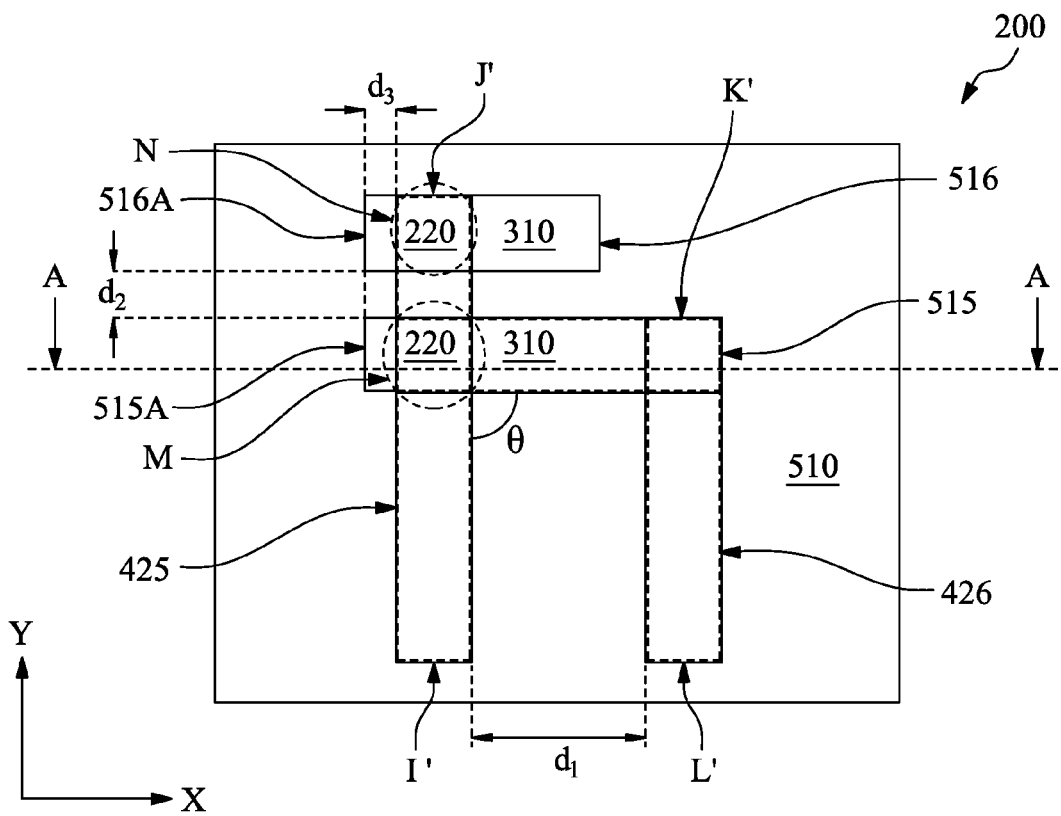
Figure 6D:
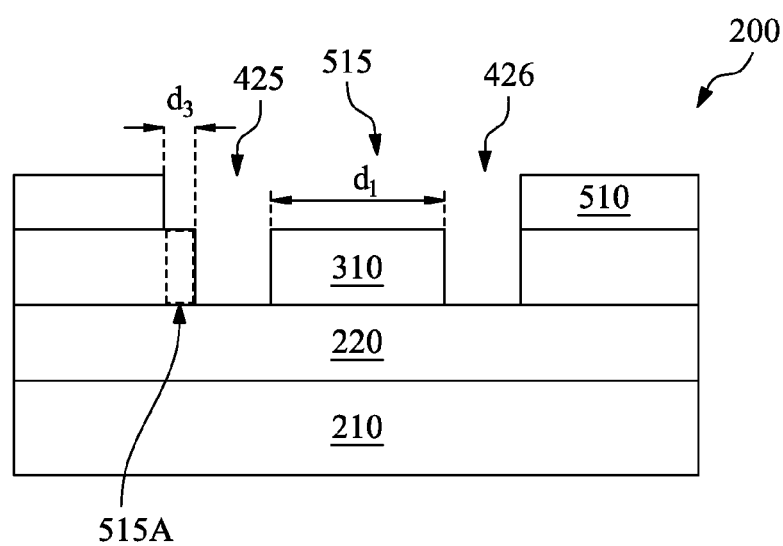

Referring to FIGS. 6C and 6D, in some embodiments, the third opening 515 and the fourth opening 516 extend to outside of the first trench 425 at the first and second location, M and N, respectively. They may provide insurance-like portions for line end distortion at respective opening ends of third and fourth openings, 515 and 516, with the first trench 425 at the first and second location, M and N, respectively. The extending portions of the third and fourth openings, 515 and 516, are referred to as the extending openings, 515A and 516A, respectively. As an example, the extending openings, 515A and 516A have a third distance $d_3$. In some other embodiments, the third opening 515 and the fourth opening 516 may have extending openings at the third trench end K' as well.

Figure 7A:
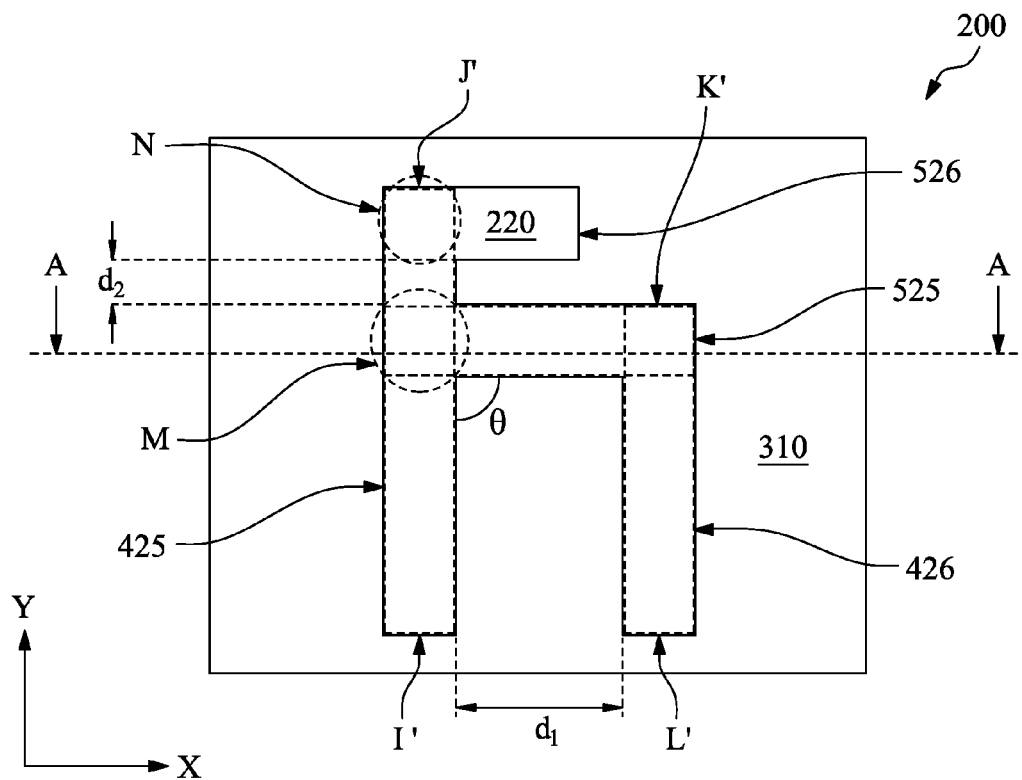
FIGS. 7A and 7C are top views of an example of a semiconductor device in accordance with some embodiments.
Figure 7B:
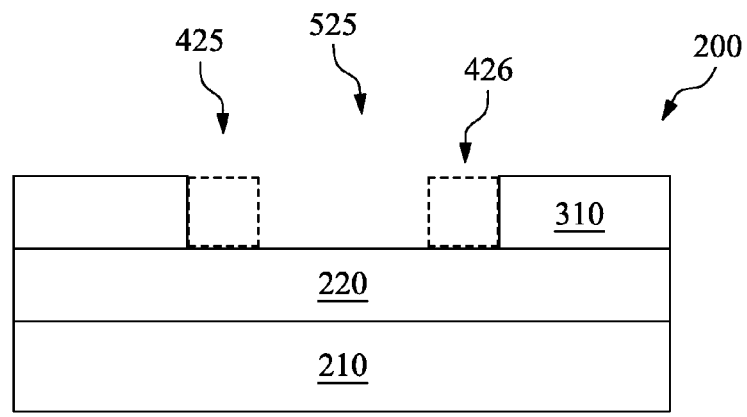
FIGS. 7B and 7D are cross-sectional views of an example semiconductor device in accordance with some embodiments, along the line A-A in FIGS. 7A and 7C, respectively.

Referring to FIGS. 1 and 7A-7B, method 100 proceeds to step 110 by etching the HM 310 through the second patterned resist 510 to transfer the third and fourth openings, 515 and 516, to a third and a fourth trenches, 525 and 526 in the HM 310, respectively. The HM 310 is etched similarly in many respects to the etching process first patterned discussed above association with FIGS. 5A-5B. The etch process is properly chosen to selectively remove the HM 310 but does not substantially etch the material layer 220. A resist strip process is then applied to remove any remaining second patterned resist layers 510.

In the present embodiment, at the first location M, the third trench 525 overlaps perpendicularly with the first trench 425 with an angle θ to form a L-shape trench. Since the first trench 425 is formed by the first etch process through the first patterned resist layer 410 and the second trench 525 is formed by the second etch process through the second patterned resist layer 510, irregularities/distortions (e.g. rounded corner) at the first location M caused by each of lithography processes are greatly reduced and the angle θ is about 90 degree. At the second location N, as has been mentioned previously, a final trench end contour may be defined by the first trench 425. Thus, a line end shortening in the fourth opening 516 may not affect trench end contour of the first trench 425 at the second location N.

Figure 7C:
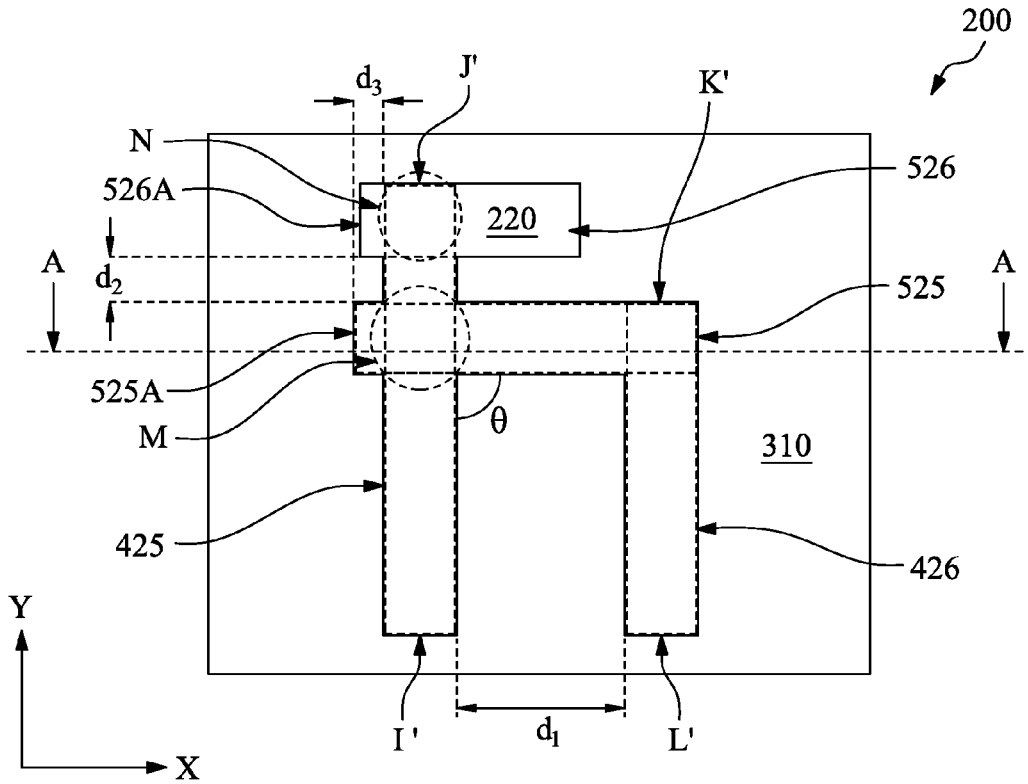
Figure 7D:
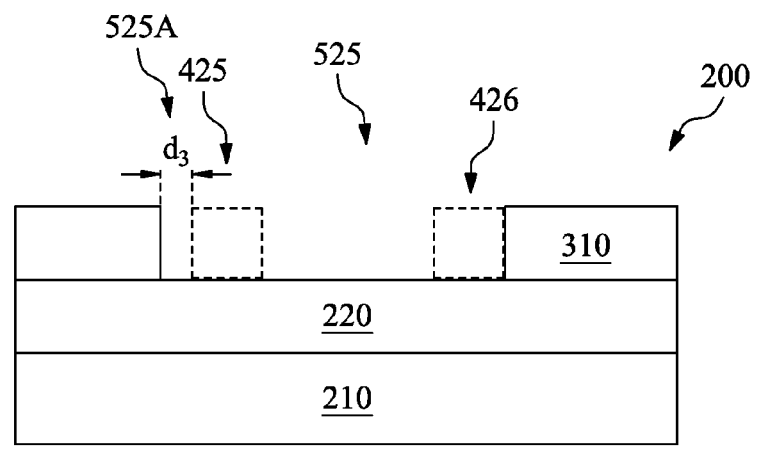

Referring to FIGS. 7C-7D, in some embodiments, the extending openings 515A and 516A are transferred to extending trenches 525A and 526A respectively as well.

Figure 8A:
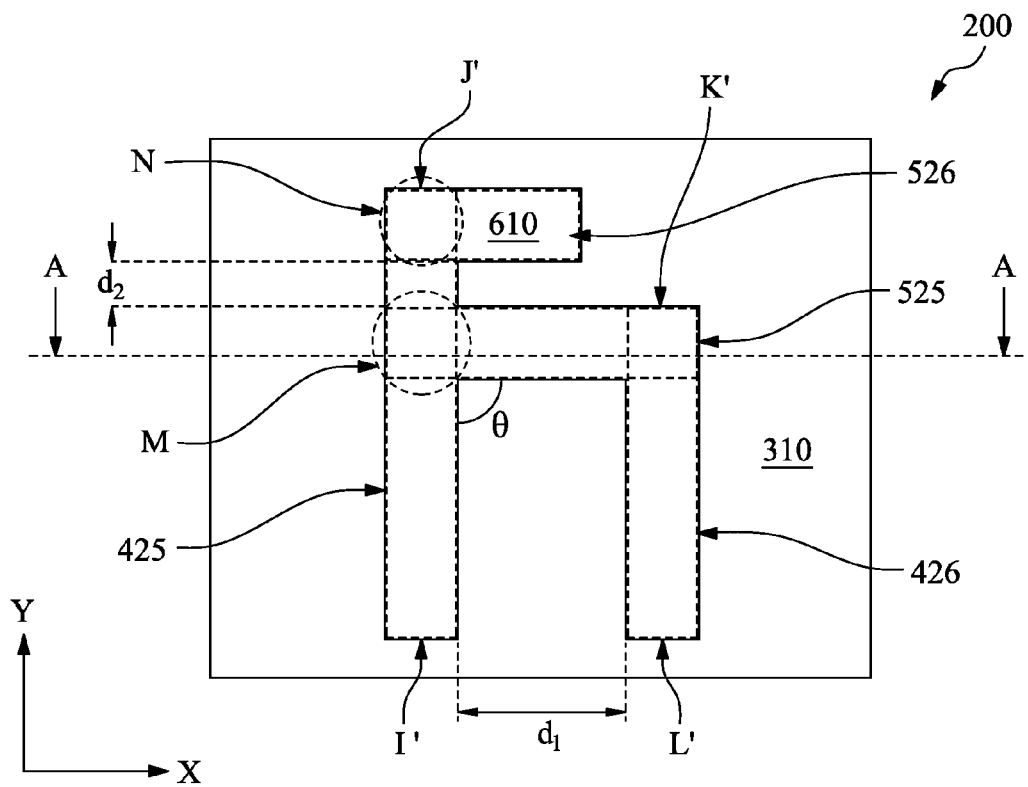
FIGS. 8A and 8C are top views of an example of a semiconductor device in accordance with some embodiments.
Figure 8B:
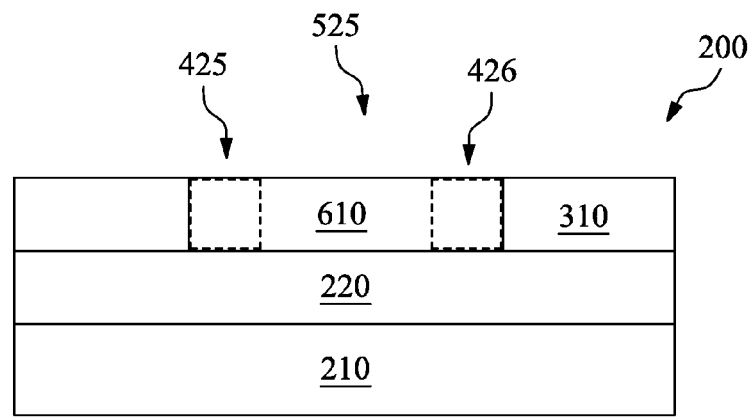
FIGS. 8B and 8D are cross-sectional views of an example semiconductor device in accordance with some embodiments, along the line A-A in FIGS. 8A and 8C, respectively.

Referring to FIGS. 1 and 8A-8B, method 100 proceeds to step 112 by depositing a sacrificial layer 610 to fill in the first, second, third and fourth trenches, 425, 426, 525 and 526. The sacrificial layer 610 may include spin-on glass, silicon oxide, silicon nitride, oxynitride, silicon carbide, and/or other suitable materials. In one embodiment, the sacrificial layer 610 includes a material which is different from the material layer 220 and the HM 310 to achieve etching selectivity subsequent etches. The sacrificial layer 610 may be deposited by CVD, PVD, ALD, spin-on coating, or other suitable techniques. In the one embodiment, the sacrificial layer 610 is then etched back to planarize with surfaces of the HM 310.

Figure 8C:
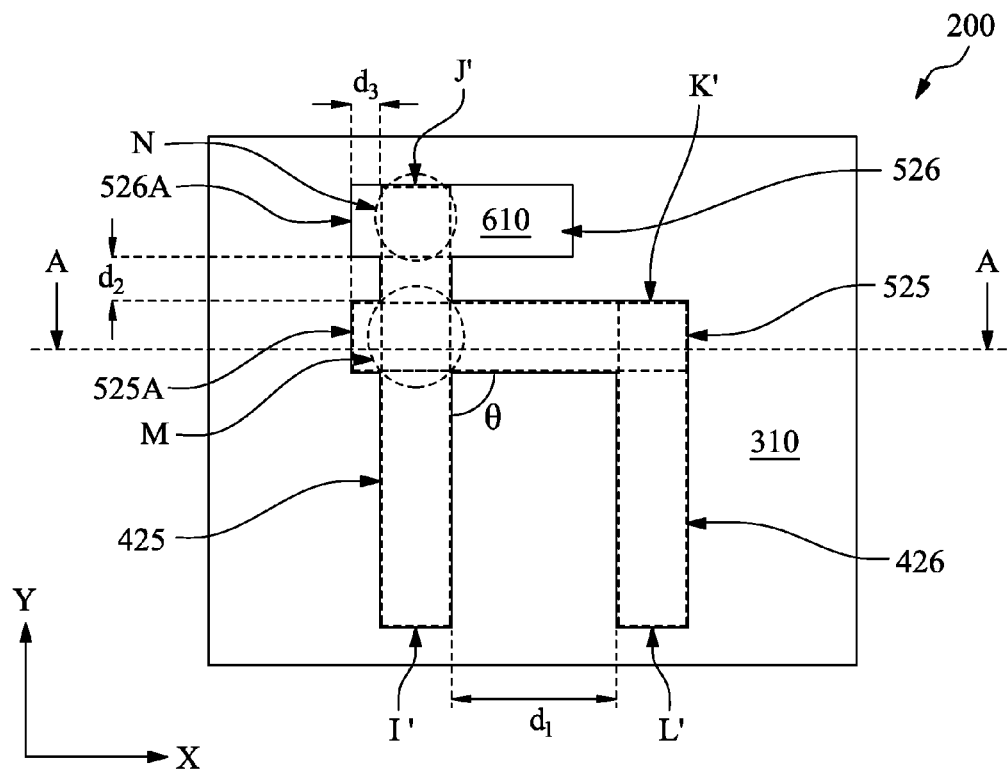
Figure 8D:
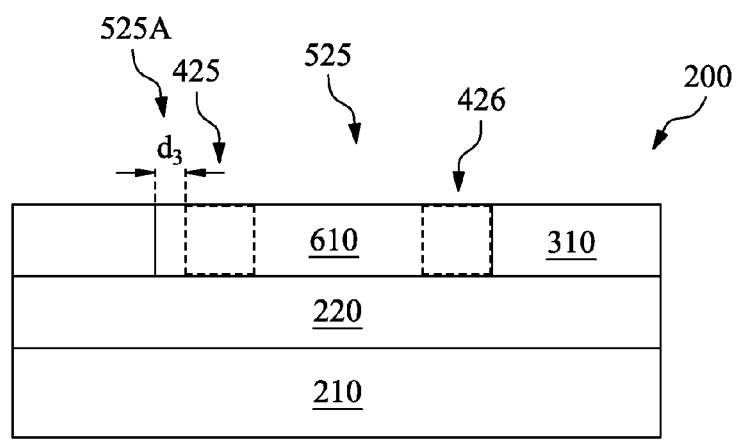

Referring to FIGS. 8C-8D, in some embodiments, the sacrificial layer 610 fills in the extending trenches 525A and 526A respectively as well.

Figure 9A:
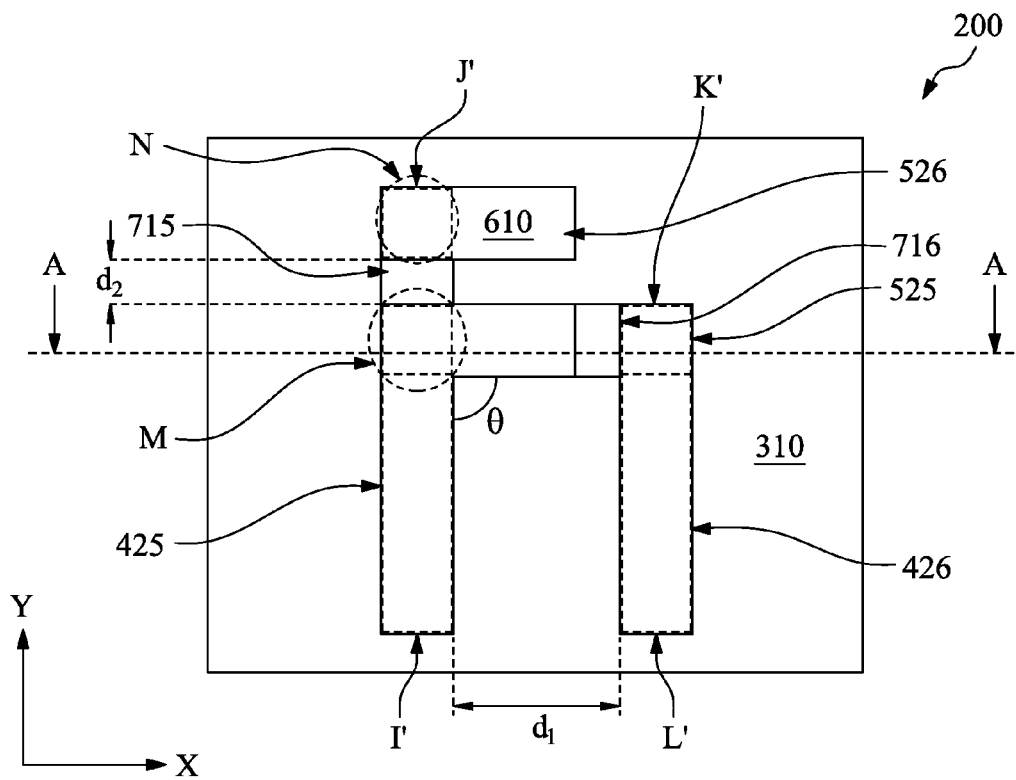
FIGS. 9A and 9C are top views of an example of a semiconductor device in accordance with some embodiments.
Figure 9B:
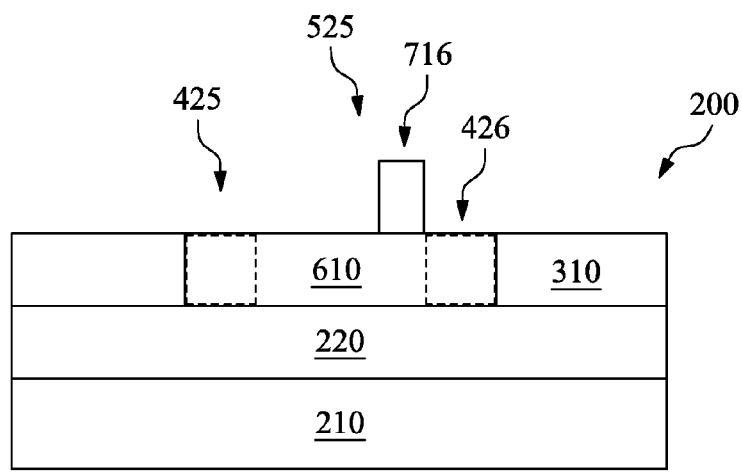
FIGS. 9B and 9D are cross-sectional views of an example semiconductor device in accordance with some embodiments, along the line A-A in FIGS. 9A and 9C, respectively.

Referring to FIGS. 1 and 9A-9B, method 100 proceeds to step 114 by forming a first and second resist blocks, 715 and 716, over the sacrificial layer 610. The first resist block 715 is aligned to the first trench 425 such that it covers a respective portion of the first trench 425 between the third trench 525 and the fourth trench 526 (between the first location M and the second location N). The second resist block 716 is aligned to the third trench 525 such that it is along a side of the second trench 426. In some embodiment, a distance between the first resist block 715 and the second resist block 716 is chosen to be greater than a threshold distance $d_{th}$ of the lithography exposing process. Thus, the first and second resist block, 715 and 716, are formed with regular contours (such as a rectangular contour). The first and second resist blocks, 715 and 716, may be formed by performing a third lithography process, which is similarly in many respects to forming the first patterned resist layer 410 discussed above association with FIGS. 4A-4B.

Figure 9C:
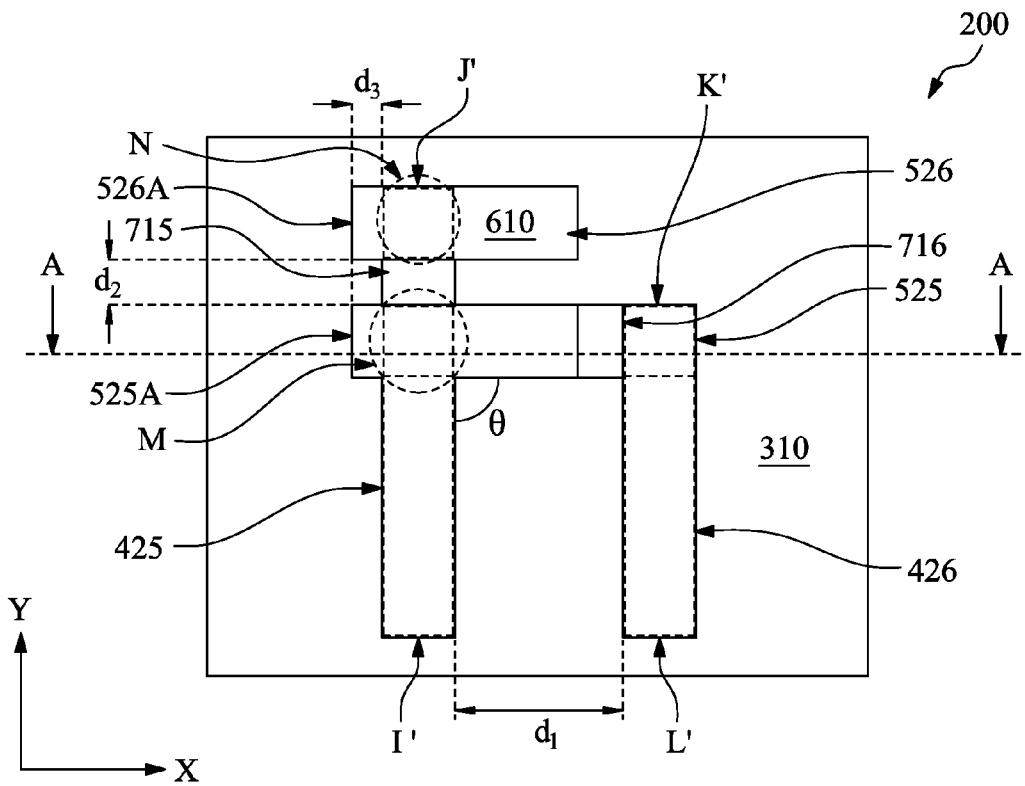
Figure 9D:
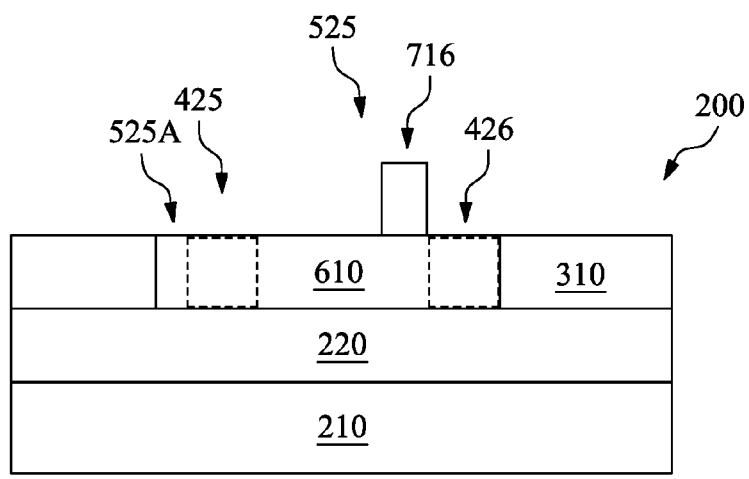

FIGS. 9C-9D show that, in some embodiments, the first resist block 715 is aligned to the first trench 425 and covers the respective portion of the first trench 425 between the third trench 525 and the fourth trench 526, which has the extending trench 526A. And the second resist block 716 is aligned to the third trench 525 having the extending trench 525A, such that it is along a side of the second trench 426.

Figure 10A:
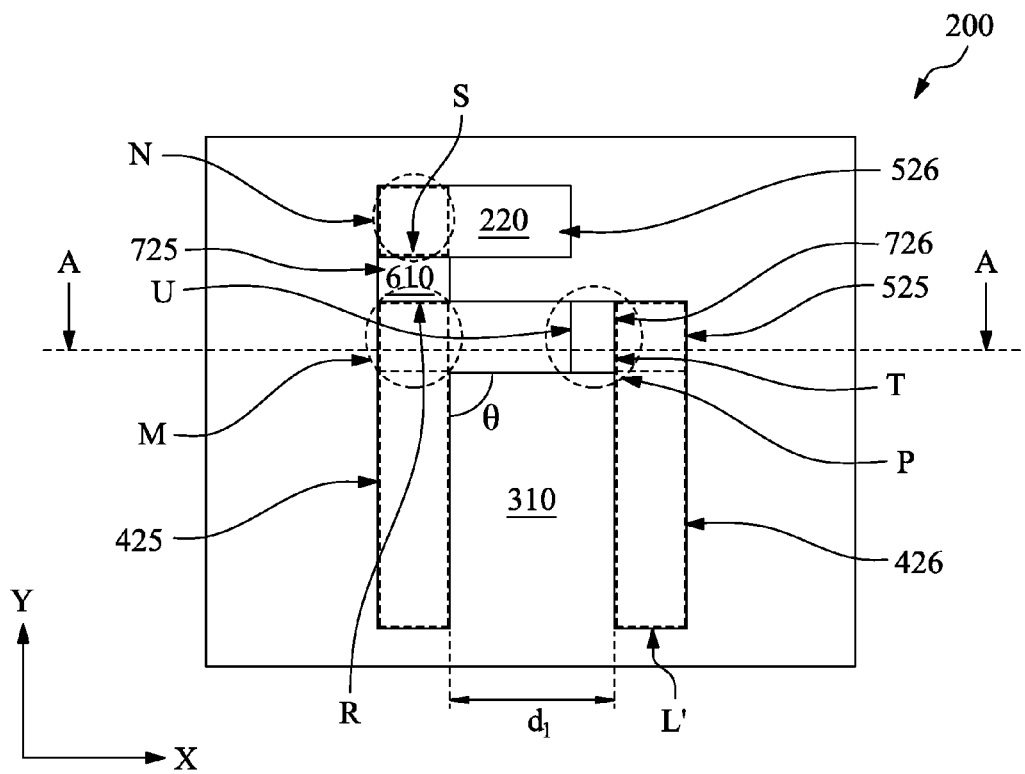
FIGS. 10A and 10C are top views of an example of a semiconductor device in accordance with some embodiments.
Figure 10B:
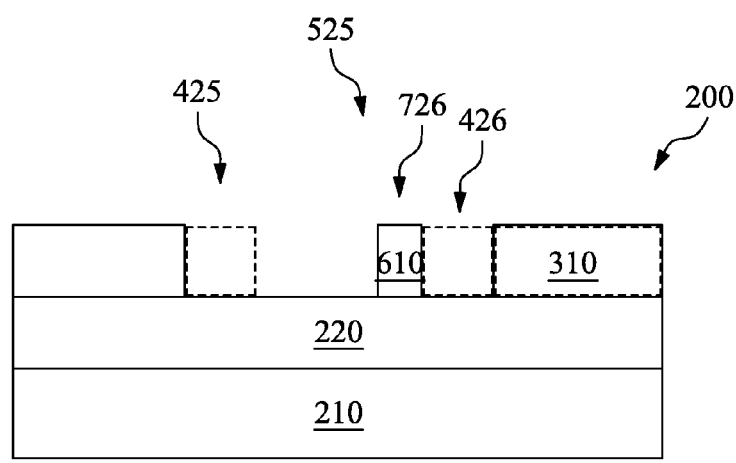
FIGS. 10B and 10D are cross-sectional views of an example semiconductor device in accordance with some embodiments, along the line A-A in FIGS. 10A and 10C, respectively.

Referring to FIGS. 1 and 10A-10B, method 100 proceeds to step 116 by etching the sacrifice layer 610 to transfer the first and second resist blocks, 715 and 725, to a first and second trench-filler-feature (TFF), 725 and 726, respectively. The first TFF 725 separates the first trench 425 from the fourth trench 526. That is, the first TFF 725 serves as a sidewall of the third trench 525 at the first location M and a sidewall of the fourth trench 526 at the second location N. And the second TFF 726 separates the second trench 426 from the third trench 525. That is, the second TFF 726 serves as a sidewall of the second trench 426 at a third location P and as a sidewall of the third trench 525 at the third location P. The etch process is properly chosen to selectively remove the sacrificial layer 610 but does not substantially etch the HM 310 and the material layer 220. The first and second resist blocks, 715 and 716, are removed by another etch process.

Figure 10C:
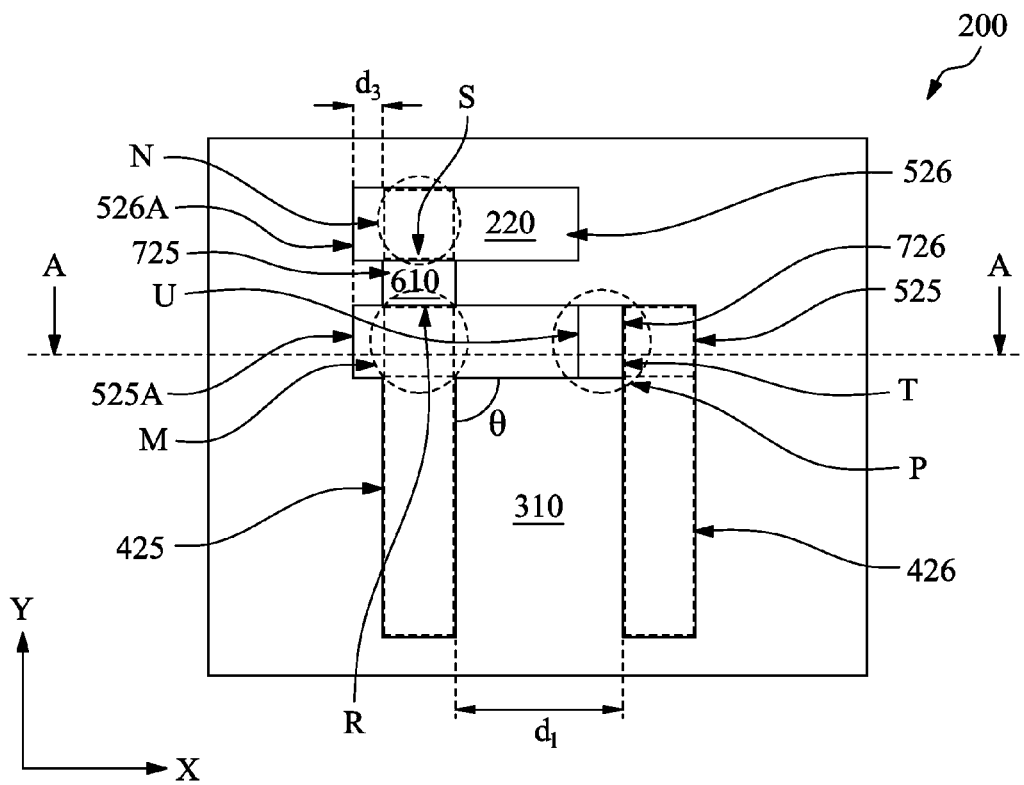
Figure 10D:
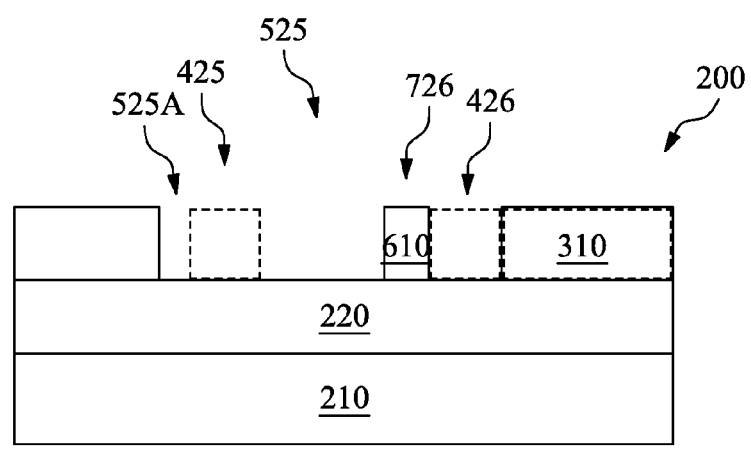

FIGS. 10C-10D show that, in some embodiments, the first TFF 725 separates the first trench 425 from the fourth trench 526 having the extending trench 526A and the second TFF 726 separates the second trench 426 from the third trench 525 having the extending trench 525A.

Figure 11A:
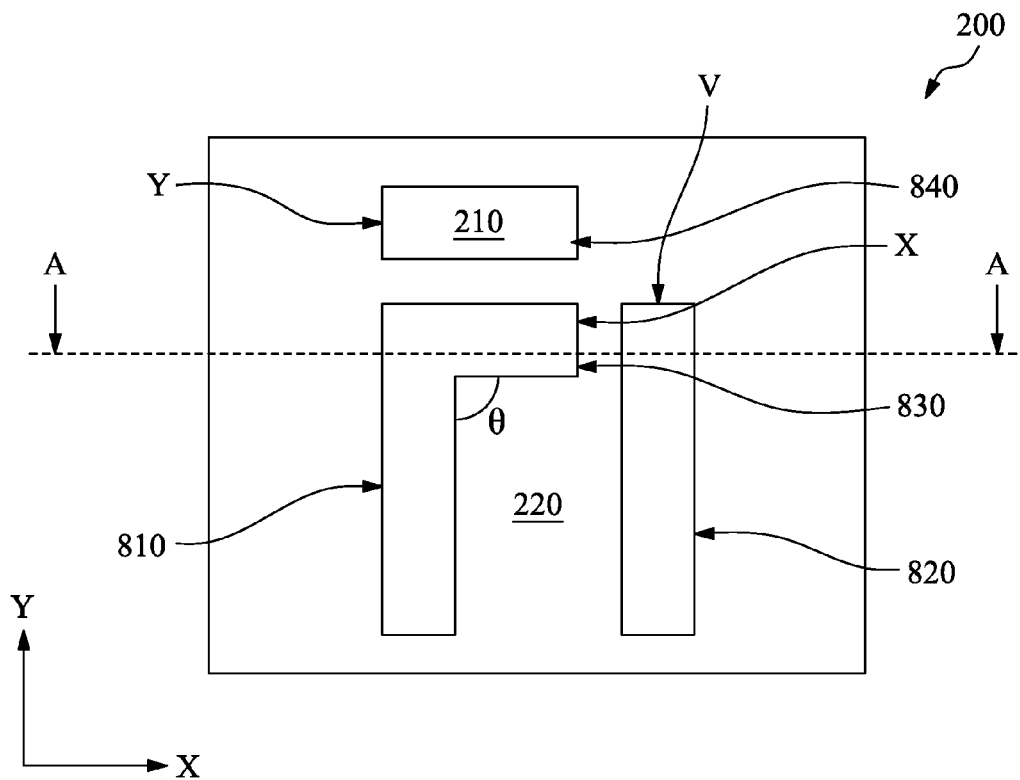
FIGS. 11A and 11C are top views of an example of a semiconductor device in accordance with some embodiments.
Figure 11B:
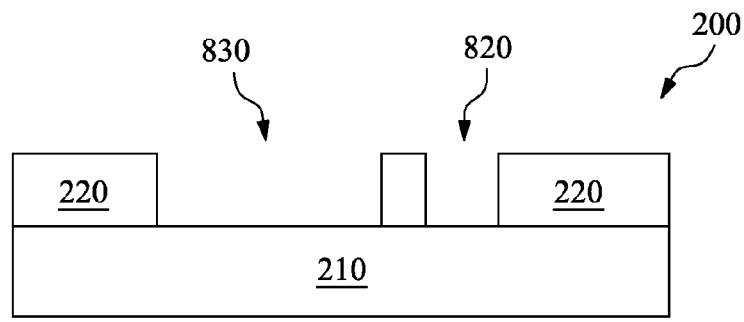
FIGS. 11B and 11D are cross-sectional views of an example semiconductor device in accordance with some embodiments, along the line A-A in FIGS. 11A and 11C, respectively.

Referring to FIGS. 1 and 11A-11B, method 100 proceeds to step 118 by etching the material layer 220 by using the HM 310 as an etch mask to transfer the first, second, third and fourth trenches, 425, 426, 525 and 526, to a fifth, sixth, seventh and eighth trenches, 810, 820, 830 and 840, respectively, in the material layer 220. In some embodiment, respective portions of the substrate 210 are exposed in the fifth, sixth, seventh and eighth trenches, 810, 820, 830 and 840. In present embodiment, the etch process includes an anisotropic dry etch. For example, the etch process is a plasma anisotropic etch. The HM 310 is then removed by a proper etch process.

Referring again to FIG. 11B, thus the material layer 220 has the fifth, sixth, seventh and eighth trenches, 810, 820, 830 and 840, such that the fifth trench 810 connects to the seventh trench 830 with the 90-degree connecting angle θ to form a L-shape trench; the sixth trench 820 is parallel to the fifth trench 810 and has a trench end V adjacent to a trench end X of the seventh trench 830; the eighth trench 840 is parallel to the seventh trench 830 and has a trench end Y adjacent to the fifth trench 810. All of trench ends, V, X and Y are formed with regular contours (such as a rectangular contour).

Figure 11C:
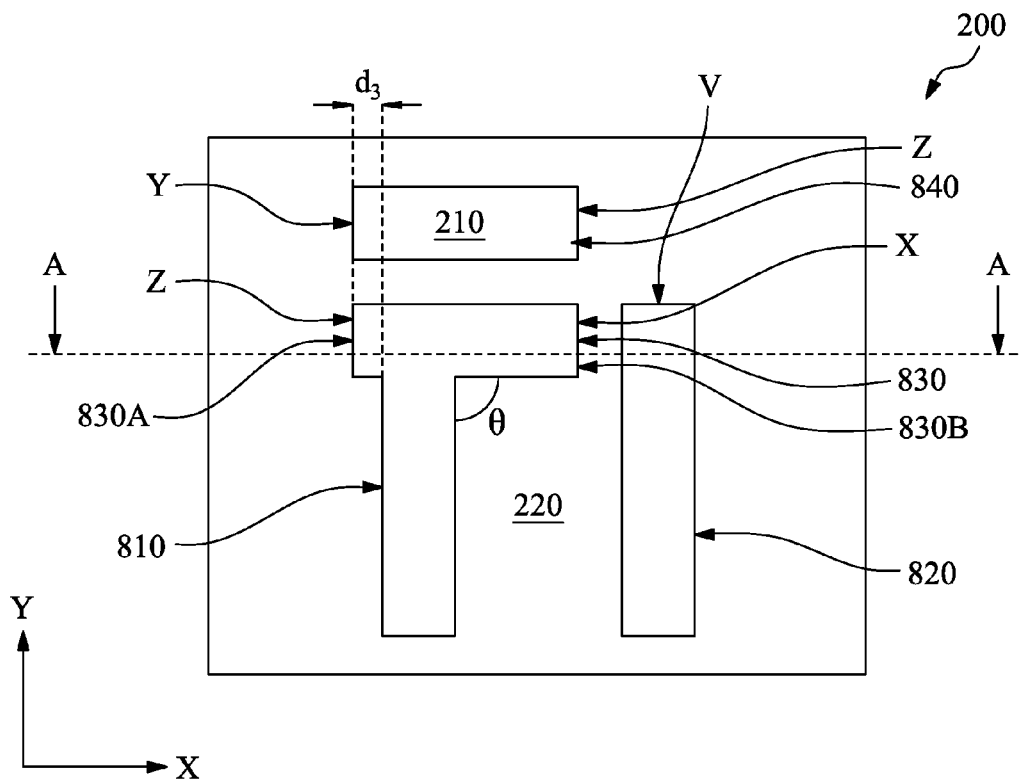
Figure 11D:
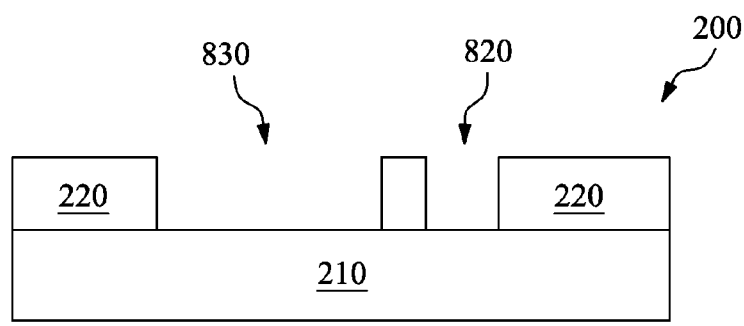

FIGS. 11C-11D show that, in some embodiments, the seventh trench 830 has the trench end V extending outside the fifth trench 810 by the third distance $d_3$. In other words, the seventh trench 830 has a short portion 830A extending outside of one side of the fifth trench 810 and a long portion 830B extending outside of another side of the fifth trench 810.

Additional steps can be provided before, during, and after the method 100, and some of the steps described can be replaced, eliminated, or moved around for additional embodiments of the method 100. Other alternatives or embodiments may present without departure from the spirit and scope of the present disclosure.

The semiconductor device 200 may undergo further CMOS or MOS technology processing to form various features and regions known in the art. For example, subsequent processing may form metal lines in the fifth, sixth, seventh and eighth trenches, 810, 820, 830 and 840. For another example, various contacts/vias and multilayers interconnect features (e.g., interlayer dielectrics) over the substrate 210, configured to connect the various features or structures of the semiconductor device 200.

Based on the above, it can be seen that the present disclosure provides methods of forming L-shape trenches and trenches which have small space between each other. The method uses multiple lithography/etch cycles to forming trenches such that in each lithography/etch cycle trenches are formed along a same direction. The method also employs forming trench-filling-feature to define respective trench ends. The method demonstrates reducing rounded corner distortion in forming the L-shape trench and reducing line end shortening distortion in forming trenches having small spacing between each other.

The present disclosure provides many different embodiments of fabricating a semiconductor device that provide one or more improvements over existing approaches. In one embodiment, a method for fabricating a semiconductor device includes forming a hard mask (HM) layer over a material layer, forming a first trench in the HM layer, which extends along a first direction. The method also includes forming a first patterned resist layer over the HM layer. The first patterned resist layer has a first opening and a second opening such that the first opening extends along a second direction that is perpendicular to the first direction and overlaps with the first trench in a middle portion of the first trench; the second opening is parallel to the first opening and overlaps with the first trench at an end portion of the first trench. The method also includes etching the HM layer through the first patterned resist layer to form a second trench and a third trench in the HM layer and forming a first feature to fill in a section of the first trench between the second trench and the third trench.

In another embodiment, a method includes forming a hard mask (HM) layer over a material layer, forming a first trench and a second trench in the HM layer. The first trench extends along a first direction and the second trench is parallel to the first trench. The method also includes forming a first patterned resist layer having a first opening and a second opening over the HM layer such that the first opening extends along a second direction, which is perpendicular to the first direction. The first opening overlaps with the first trench in a middle of the first trench and overlaps with the second trench in an end of the second trench; the second opening is parallel to the first opening and overlaps with the first trench at an end of the first trench. The method also includes etching the HM layer through the first patterned resist layer to form a third trench and a fourth trench respectively in the HM layer and forming a first feature to fill in a section of the first trench between the third trench and the fourth trench and a second feature to fill in a section of the third trench along a side of the second trench facing towards to the first trench.

In yet another embodiment, a device includes a first trench extends along a first direction in a material layer and a second trench extends along a second direction in the material layer, which is perpendicular to the first direction. The second trench connects to the first trench such that a short portion of the first trench extends outside of one side of the first trench and a long portion of the first trench extends outside of another side of the first trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a hard mask (HM) layer over a material layer;
forming a first trench in the HM layer, wherein the first trench extends along a first direction;

forming a first patterned resist layer over the HM layer, wherein the first patterned resist layer has a first opening and a second opening such that:

the first opening extends along a second direction that is perpendicular to the first direction, the first opening overlaps with the first trench in a middle portion of the first trench;

the second opening is parallel to the first opening and overlaps with the first trench at an end portion of the first trench;

etching the HM layer through the first patterned resist layer to form a second trench and a third trench in the HM layer; and forming a first feature to fill in a section of the first trench between the second trench and the third trench.

2. The method of claim 1, further comprising:
after forming the first feature, etching the material layer, by using the HM layer as an etch mask, to transfer the first trench, the second trench and third trench to the material layer.

3. The method of claim 1, wherein the first trench connects to the second trench with an angle of about 90 degree.

4. The method of claim 1, further comprising:
during forming the first trench in the HM layer, forming a fourth trench in the HM layer, wherein the fourth trench is parallel to the first trench.

5. The method of claim 4, wherein the first opening overlaps with the first trench at one end and with the fourth trench at another end.

6. The method of claim 5, wherein the second trench overlaps with the first trench at one end and with the fourth trench at another end.

7. The method of claim 6, further comprising forming a second feature to fill in a second of the second trench along a side of the fourth trench facing to the first trench.

8. The method of claim 7, further comprising:
after forming the second feature, etching the material layer, by using the HM layer as an etch mask, to transfer the fourth trench to the material layer.

9. The method of claim 8, wherein the fourth trench in the material layer is separated to the second trench in the material layer.

10. The method of claim 1, wherein forming the first feature to fill in the section of the first trench between the second trench and the third trench includes:
depositing a sacrificial layer over the HM layer, including filling in the first trench;
forming a second pattern resist layer to cover a portion of the sacrificial layer; and
etching the sacrificial layer through the second patterned resist layer, wherein the sacrificial layer covered by the second patterned resist layer remains.

11. The method of claim 1, further comprising extending the first opening in the first patterned resist layer to outside the first trench.

12. The method of claim 1, further comprising:
after forming the first feature, etching the material layer, by using the HM layer as an etch mask, to transfer the first trench, the second trench and third trench to the material layer.

13. A method comprising:
forming a hard mask (HM) layer over a material layer;
forming a first trench and a second trench in the HM layer, wherein the first trench the first trench is along a first direction, wherein the second trench is parallel to the first trench;

forming a first patterned resist layer having a first opening and a second opening over the HM layer such that:

the first opening is along a second direction, which is perpendicular to the first direction, wherein it overlaps with the first trench in a middle of the first trench and overlaps with the second trench;

the second opening is parallel to the first opening and overlaps with the first trench at an end of the first trench;

etching the HM layer through the first patterned resist layer to form a third trench and a fourth trench respectively in the HM layer; and forming a first feature to fill in a section of the first trench between the third trench and the fourth trench and a second feature to fill in a section of the third trench along a side of the second trench facing towards to the first trench.

14. The method of claim 13, further comprising:
after forming the first feature and the second feature, etching the material layer, by using the HM layer as an etch mask, to transfer the first trench, the second trench, the third trench and fourth trench to the material layer.

15. The method of claim 14, wherein the second trench in the material layer is separated to the third trench in the material layer.

16. The method of claim 13, wherein the first trench connects to the third trench with an angle of about 90 degree.

17. The method of claim 13, wherein forming the first feature to fill in the section of the first trench between the third trench and the fourth trench and the second feature to fill in the section of the third trench along the side of the second trench facing towards to the first trench includes:
depositing a sacrificial layer over the HM layer, including filling in the first trench and the third trench;
forming a second pattern resist layer to cover respective portions of the sacrificial layer; and
etching the sacrificial layer through the second patterned resist layer, wherein the portions of the sacrificial layer covered by the second patterned resist layer remain.

18. The method of claim 13, further comprising extending the first opening to outside the first trench in the first patterned resist layer.

19. The method of claim 13, further comprising transferring the extended first opening to an extended third trench in the material layer.

20. A method comprising:
forming a hard mask (HM) layer over a material layer;
forming a first trench in the HM layer, wherein the first trench extends along a first direction;
forming a first patterned resist layer over the HM layer, wherein the first patterned resist layer has a first opening and a second opening such that:

the first opening extends along a second direction that is perpendicular to the first direction, the first opening overlaps with the first trench in a first portion of the first trench;

the second opening is parallel to the first opening and overlaps with the first trench at an second portion of the first trench;

etching the HM layer through the first patterned resist layer to form a second trench and a third trench in the HM layer; and forming a first feature to fill in a section of the first trench between the second trench and the third trench.

* * * * *